United States Patent
Guyette et al.

(10) Patent No.: US 11,405,017 B2
(45) Date of Patent: Aug. 2, 2022

(54) ACOUSTIC MATRIX FILTERS AND RADIOS USING ACOUSTIC MATRIX FILTERS

(71) Applicant: Resonant Inc., Goleta, CA (US)

(72) Inventors: Andrew Guyette, San Mateo, CA (US); Neal Fenzi, Santa Barbara, CA (US)

(73) Assignee: Resonant Inc., Austin, TX (US)

( * ) Notice: Subject to any disclaimer, the term of this patent is extended or adjusted under 35 U.S.C. 154(b) by 81 days.

(21) Appl. No.: 17/121,724

(22) Filed: Dec. 14, 2020

(65) Prior Publication Data

US 2022/0109420 A1    Apr. 7, 2022

Related U.S. Application Data

(60) Provisional application No. 63/087,789, filed on Oct. 5, 2020.

(51) Int. Cl.
  *H03H 9/205* (2006.01)
  *H04B 1/00* (2006.01)
  *H03H 9/54* (2006.01)
  *H03H 9/70* (2006.01)

(52) U.S. Cl.
  CPC .............. *H03H 9/205* (2013.01); *H03H 9/54* (2013.01); *H03H 9/542* (2013.01); *H03H 9/706* (2013.01); *H04B 1/0057* (2013.01)

(58) Field of Classification Search
  CPC .......... H03H 9/205; H03H 9/54; H03H 9/542; H03H 9/706; H04B 1/0057
  See application file for complete search history.

(56) References Cited

U.S. PATENT DOCUMENTS

| | | | |
|---|---|---|---|
| 6,724,278 B1 * | 4/2004 | Smith | H04B 1/52 333/133 |
| 10,079,414 B2 | 9/2018 | Guyette et al. | |
| 10,491,192 B1 | 11/2019 | Plesski et al. | |
| 2021/0399750 A1 * | 12/2021 | Varela Campelo | H03H 9/542 |

FOREIGN PATENT DOCUMENTS

CN    209608623 U  *  11/2019  ........... H03H 9/6489

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963.

* cited by examiner

*Primary Examiner* — Stephen E. Jones
*Assistant Examiner* — Kimberly E Glenn
(74) *Attorney, Agent, or Firm* — SoCal IP Law Group LLP; Angelo Gaz

(57) ABSTRACT

There are disclosed acoustic filters and radios incorporating the acoustic filters. A filter includes a first filter port, a second filter port, and n sub-filters, where n is an integer greater than one. Each sub-filter has a first sub-filter port connected to the first filter port and a second sub-filter port connected to the second filter port. A first acoustic resonator is connected from the first filter port to ground, and a second acoustic resonator is connected from the second filter port to ground. The first and second acoustic resonators are configured to create respective transmission zeros adjacent to a lower edge of a passband of the filter.

18 Claims, 13 Drawing Sheets

ACOUSTIC MATRIX FILTERS AND RADIOS USING ACOUSTIC MATRIX FILTERS

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims priority from provisional patent application 63/087,789, filed Oct. 5, 2020, entitled MATRIX XBAR FILTER.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz. Matrix XBAR filters are also suited for frequencies between 1 GHz and 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
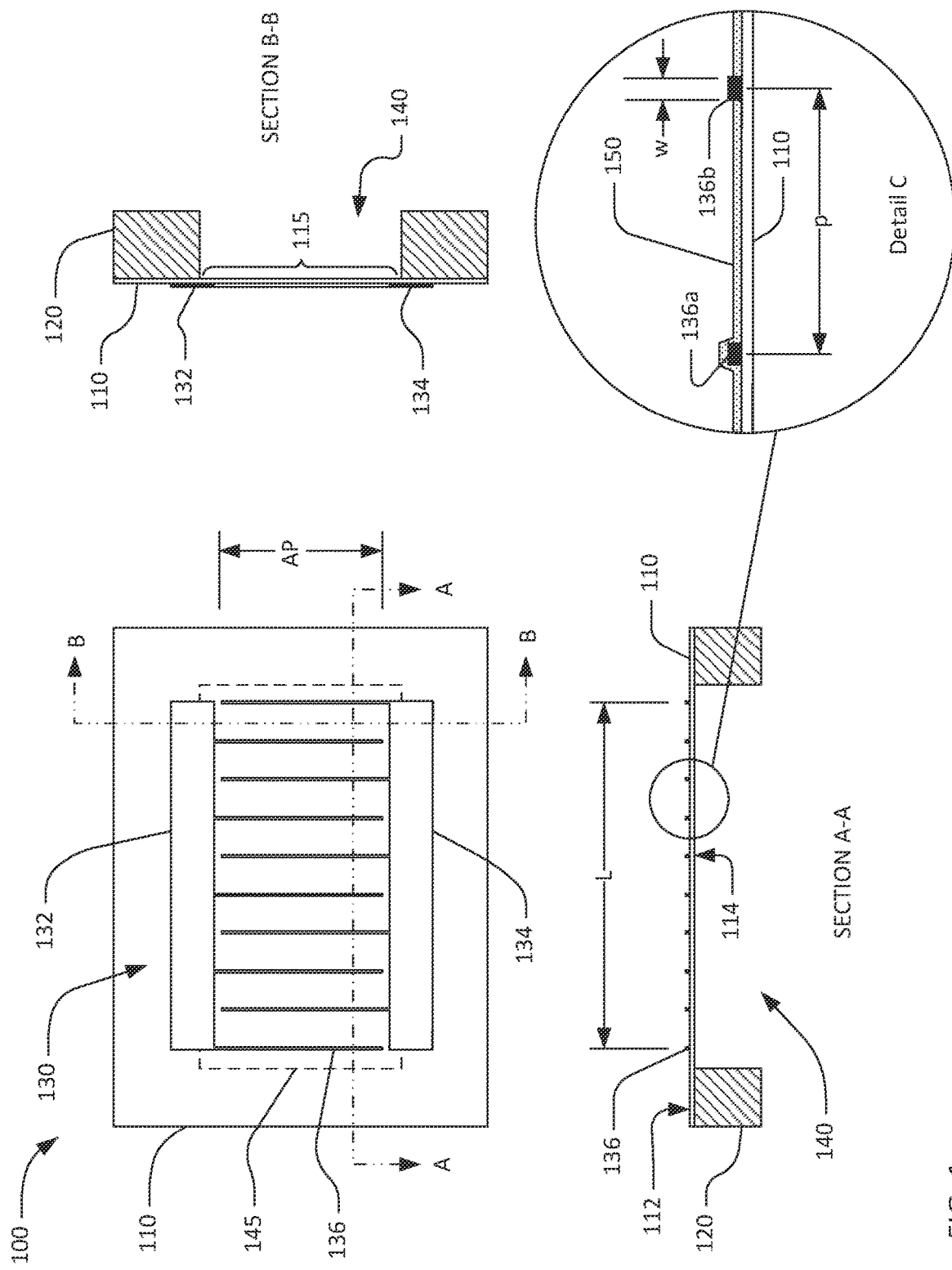
FIG. 1 includes a schematic plan view, two schematic cross-sectional views, and a detailed cross-sectional view of a transversely-excited film bulk acoustic resonator (XBAR).

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz. The matrix XBAR filters described in this patent are also suited for frequencies above 1 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode of an XBAR is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

The detailed cross-section view (Detail C) shows two IDT fingers 136a, 136b on the surface of the piezoelectric plate 110. The dimension p is the "pitch" of the IDT and the dimension w is the width or "mark" of the IDT fingers. A dielectric layer 150 may be formed between and optionally over (see IDT finger 136a) the IDT fingers. The dielectric layer 150 may be a non-piezoelectric dielectric material, such as silicon dioxide or silicon nitride. The dielectric layer 150 may be formed of multiple layers of two or more materials. The IDT fingers 136a and 136b may be aluminum, copper, beryllium, gold, tungsten, molybdenum, alloys and combinations thereof, or some other conductive material. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars of the IDT 130 may be made of the same or different materials as the fingers.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

An XBAR based on shear acoustic wave resonances can achieve better performance than current state-of-the art surface acoustic wave (SAW), film-bulk-acoustic-resonators (FBAR), and solidly-mounted-resonator bulk-acoustic-wave (SMR BAW) devices. In particular, the piezoelectric coupling for shear wave XBAR resonances can be high (>20%) compared to other acoustic resonators. High piezoelectric coupling enables the design and implementation of microwave and millimeter-wave filters of various types with appreciable bandwidth.

Figure 2B:
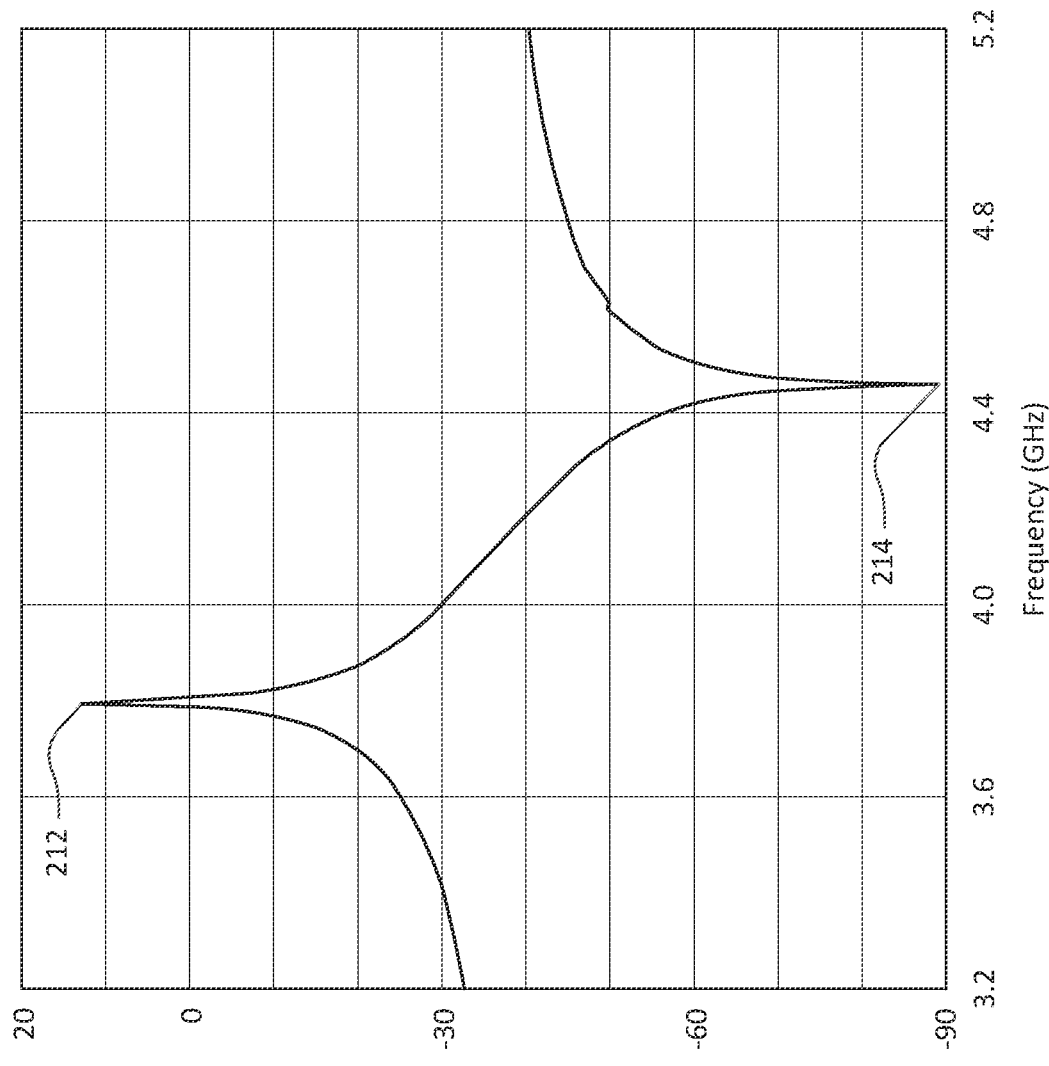
FIG. 2B is a graph of the admittance of an ideal acoustic resonator.
Figure 2A:
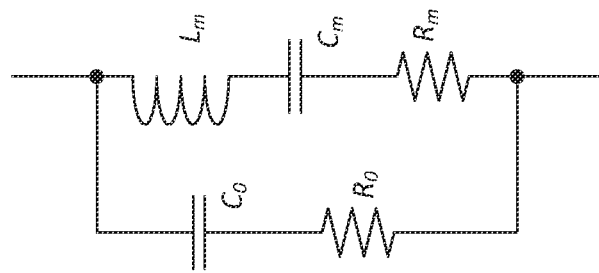
FIG. 2A is an equivalent circuit model of an acoustic resonator.

The basic behavior of acoustic resonators, including XBARs, is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency $F_r$ of the motional resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

where $\gamma=C_0/C_m$ is dependent on the resonator structure and the type and the orientation of the crystalline axes of the piezoelectric material.

FIG. 2B is a graph 200 of the magnitude of admittance of a theoretical lossless acoustic resonator. The acoustic resonator has a resonance 212 at a resonance frequency where the admittance of the resonator approaches infinity. The resonance is due to the series combination of the motional inductance $L_m$ and the motional capacitance $C_m$ in the BVD model of FIG. 2A. The acoustic resonator also exhibits an anti-resonance 214 where the admittance of the resonator approaches zero. The anti-resonance is caused by the combination of the motional inductance $L_m$, the motional capacitance $C_m$, and the static capacitance $C_0$. In a lossless resonator ($R_m=R_0=0$), the frequency $F_r$ of the resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

In over-simplified terms, the lossless acoustic resonator can be considered a short circuit at the resonance frequency 212 and an open circuit at the anti-resonance frequency 214. The resonance and anti-resonance frequencies in FIG. 2B are representative, and an acoustic resonator may be designed for other frequencies.

Figure 2C:
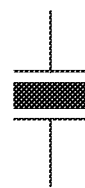
FIG. 2C is a circuit symbol for an acoustic resonator.

FIG. 2C shows the circuit symbol for an acoustic resonator such as an XBAR. This symbol will be used to designate each acoustic resonator in schematic diagrams of filters in subsequent figures.

Figures 3A, 3B:
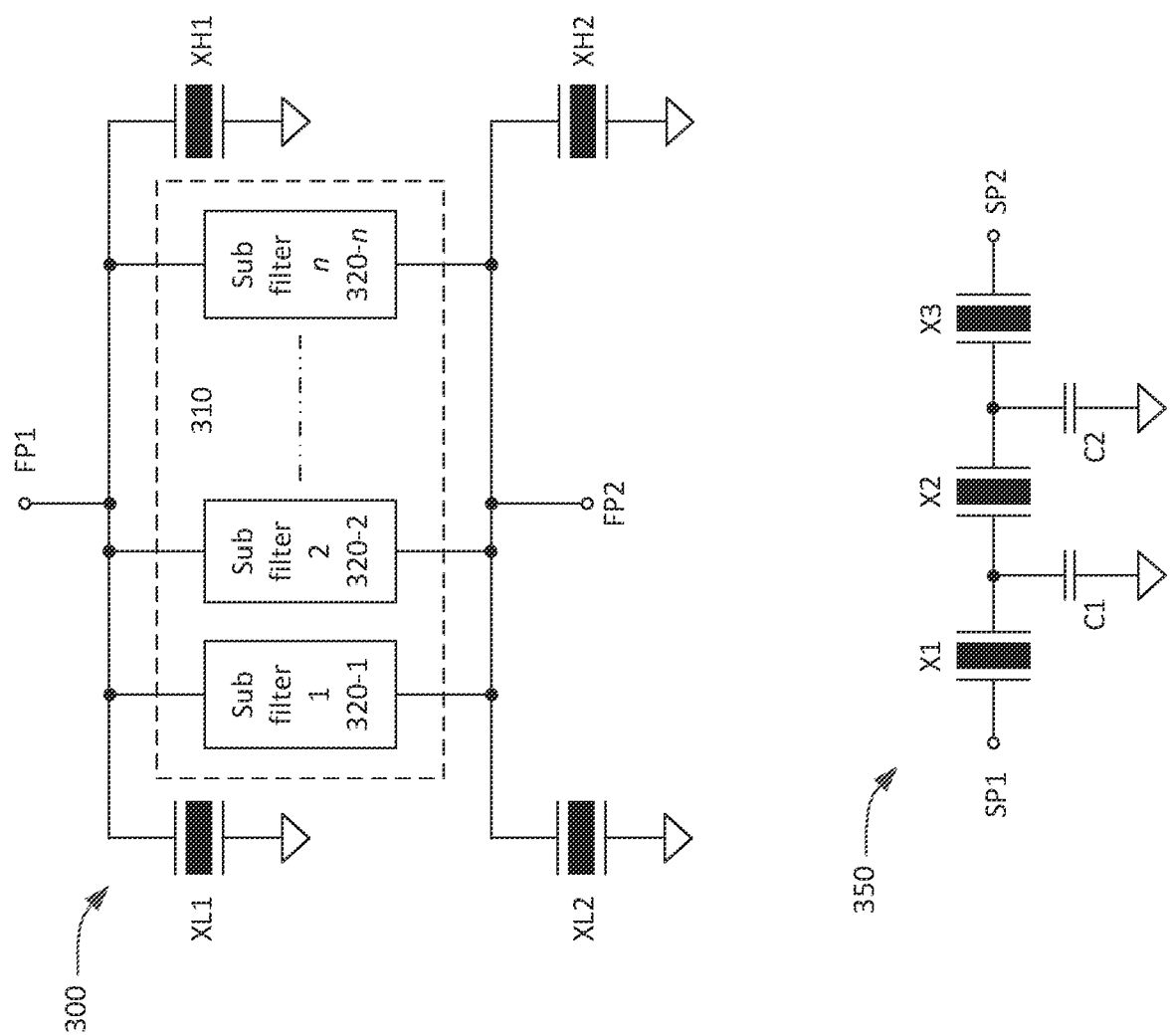
FIG. 3A is a schematic diagram of a matrix filter using acoustic resonators.
FIG. 3B is a schematic diagram of a sub-filter of FIG. 3A.

FIG. 3A is a schematic diagram of a matrix filter 300 using acoustic resonators. The matrix filter 300 includes an array 310 of n sub-filters 320-1, 320-2, 320-n connected in parallel between a first filter port (FP1) and a second filter port (FP2), where n is an integer greater than one. The sub-filters 320-1, 320-2, 320-n have contiguous passbands such that the bandwidth of the matrix filter 300 is equal to the sum of the bandwidths of the constituent sub-filters. In the subsequent examples in this patent n=3. n can be less than or greater than 3 as necessary to provide the desired bandwidth for the matrix filter 300.

The array 310 of sub-filters is terminated at both ends by acoustic resonators XL1, XL2, XH1, and XH2, which are preferably but not necessarily XBARs. The acoustic resonators XL1, XL2, XH1, and XH2 create "transmission zeros" at their respective resonance frequencies. A "transmission zero" is a frequency where the input-output transfer function of the filter is very low (and would be zero if the acoustic resonators XL1, XL2, XH1, and XH2 were lossless). Typically, the resonance frequencies of XL1 and XL2 are equal, and the resonance frequencies of XH1 and XH2 are equal. The resonant frequencies of the acoustic resonators XL1, XL2 are selected to provide transmission zeros adjacent to the lower edge of the filter passband. The acoustic resonators XL1 and XL2 also act as shunt inductances to help match the impedance at the ports of the filter to a desired impedance value. In the subsequent examples in this patent, the impedance at all ports of the filters is matched to 50 ohms. The resonant frequencies of acoustic resonators XH1, XH2 are selected to provide transmission zeros at or above the higher edge of the filter passband. Acoustic resonators XH1 and XH2 may not be required in all matrix filters.

FIG. 3B is a schematic diagram of a sub-filter 350 suitable for sub-filters 320-1, 320-2, and 320-n. The sub-filter 350 includes three acoustic resonators X1, X2, X3 connected in series between a first sub-filter port (SP1) and a second sub-filter port (SP2). The acoustic resonators X1, X2, X3 are preferably but not necessarily XBARs. The sub-filter 350 includes two coupling capacitors C1, C2, each of which is connected between ground and a respective node between two of the acoustic resonators. The inclusion of three acoustic resonators in the sub-filter 350 is exemplary. A sub-filter may have m acoustic resonators, where m is an integer greater than one. A sub-filter with m acoustic resonators includes m−1 coupling capacitors. The m acoustic resonators of a sub-filter are connected in series between the two ports SP1 and SP2 of a sub-filter and each of the m−1 coupling capacitors is connected between ground and a node between a respective pair of acoustic resonators from the m acoustic resonators.

Compared to other types of acoustic resonators, XBARs have very high electromechanical coupling (which results in a large difference between the resonance and anti-resonance frequencies), but low capacitance per unit area. The matrix filter architecture, as shown in FIG. 3A and FIG. 3B, takes advantage of the high electromechanical coupling of XBARs without requiring high resonator capacitance.

Figure 4:
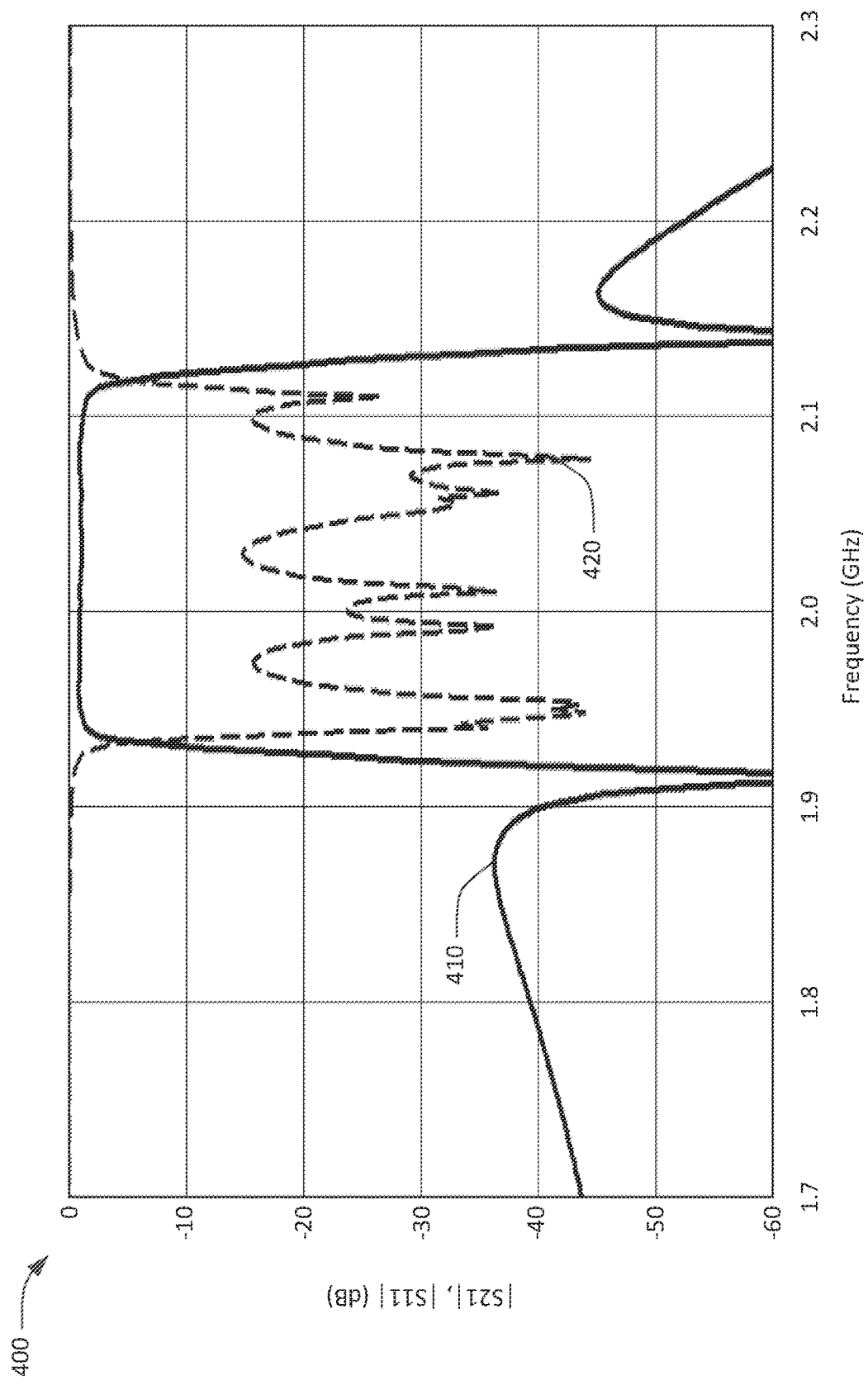
FIG. 4 is a graph of the performance of an embodiment of the filter of FIG. 3A.

FIG. 4 is a graph 400 of the performance of an exemplary embodiment of a matrix filter implemented using XBARs for all of the acoustic resonators. Specifically, the solid line 410 is a plot of S21, the FP1 to FP2 transfer function, of the filter as a function of frequency. The dashed line 420 is a plot of S11, the return loss at FP1, as a function of frequency. Since the exemplary filter is symmetrical, the solid line 410 and the dashed line 420 are also plots of S12 and S22, respectively. The matrix filter includes 3 sub-filters, with each sub-filter including three XBARs, as shown in FIG. 3A and FIG. 3B. In this example and all subsequent examples, filter performance was determined by simulating the filter using BVD models (FIG. 2A) for the XBARs.

The characteristics of the components of the matrix filter are provided in TABLE 1. Each XBAR is defined by its resonance frequency Fr and static capacitance C0. The Q of each XBAR is assumed to be 1000. γ is assumed to be 2.5, which is representative of lithium niobate XBARs. The same assumptions and component values are used in all subsequent examples in this patent.

TABLE 1

| | X1 | | X2 | | X3 | | | |
| --- | --- | --- | --- | --- | --- | --- | --- | --- |
| | Fr (MHz) | C0 (pF) | Fr (MHz) | C0 (pF) | Fr (MHz) | C0 (pF) | C1 (pF) | C2 (pF) |
| Sub-filter 1 | 1949 | 0.100 | 1933 | 0.100 | 1949 | 0.100 | 1.49 | 1.49 |
| Sub-filter 2 | 2011 | 0.077 | 1991 | 0.077 | 2011 | 0.077 | 1.31 | 1.31 |
| Sub-filter 3 | 2067 | 0.070 | 2049 | 0.070 | 2067 | 0.070 | 1.33 | 1.33 |
| XL1, XL2 | 1915 | 0.168 | | | | | | |
| XH1, XH2 | 2140 | 0.081 | | | | | | |

The exemplary matrix filter is symmetrical in that the impedances at Port 1 and Port 2 are both equal to 50 ohms. The internal circuitry of the filter is also symmetrical, with XBARs X1 and X3 within each sub-filter being the same, XL1 and XL2 being the same, and XH1 and XH2 being the same. Matrix filters may be designed to have significantly different impedances at Port 1 and Port 2, in which event the internal circuitry will not be symmetrical.

Figure 5:
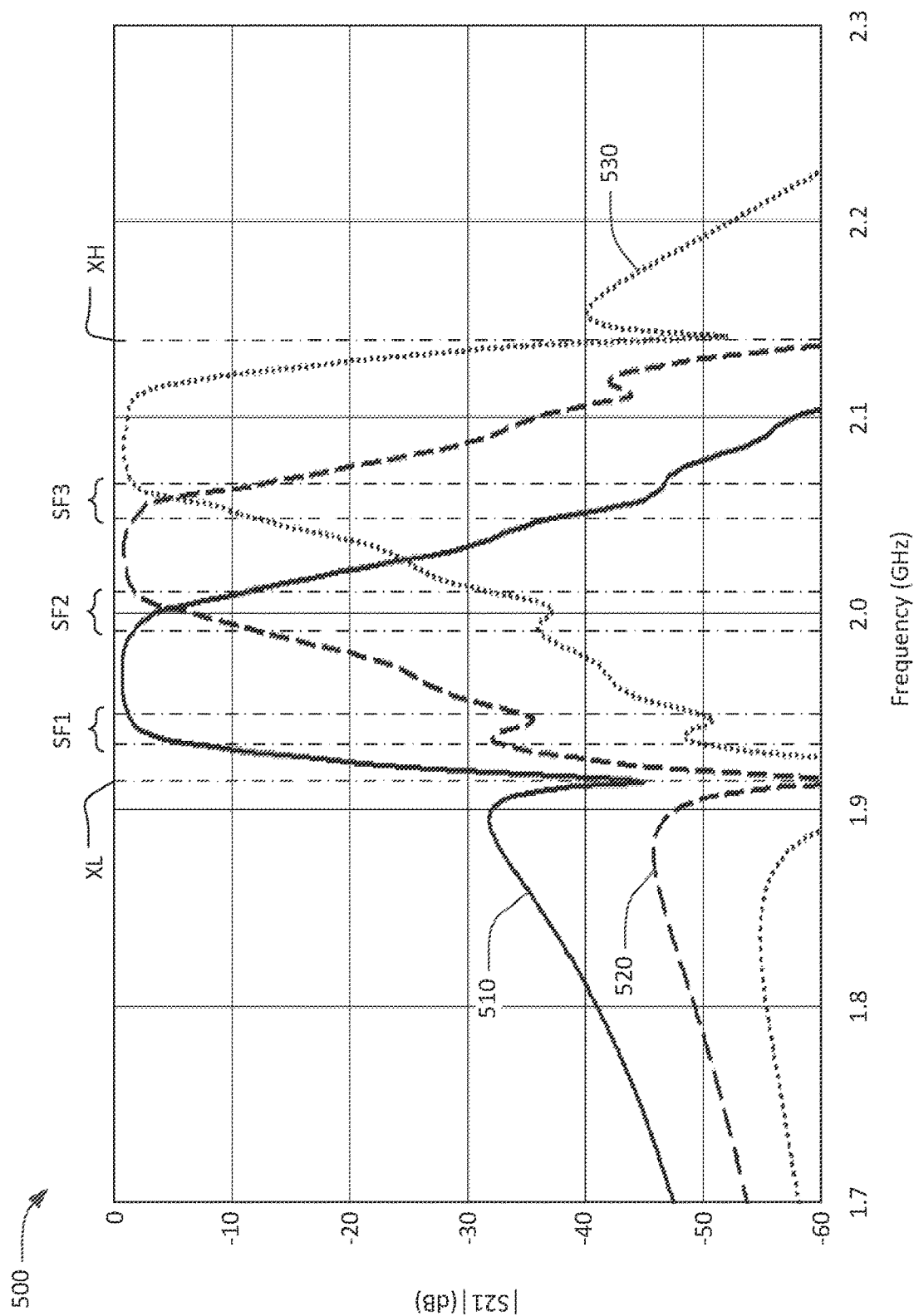
FIG. 5 is a graph of input-output transfer functions of the individual sub-filters of the embodiment of FIG. 4.

FIG. 5 is a graph of the characteristics of the elements within the exemplary matrix filter whose performance was shown in FIG. 4. Specifically, solid line 510, dashed line 520, and dotted line 530 are plots of the magnitude of the input-output transfer functions for sub-filter 1, sub-filter 2, and sub-filter 3, respectively.

The input-output transfer function of the exemplary filter, as shown in FIG. 4, is the vector sum of the input-output transfer functions of the three sub-filters. To this end, the input-output transfer functions of sub-filter 1 and sub-filter 2 cross at a frequency where (a) S21 of both filters are substantially equal to −3 dB and (b) the phases of the input-output transfer functions of both filters are substantially equal. In this context, "substantially equal" means sufficiently equal to not cause objectionable variations in the insertion loss of the matrix filter within the filter passband. The quantitative value of "substantially equal" may be different for different filter applications. Similar requirements apply to sub-filter 2 and sub-filter 3. In matrix filters with more than three sub-filters, similar requirements apply to every adjacent (in frequency) pair of sub-filters.

The vertical dot-dash lines identify the resonance frequencies of the XBARs within the exemplary matrix filter. The line labeled "XL" identifies the resonance frequency of the resonators XL1 and XL2, which is adjacent to the lower edge of the filter passband. Similarly, the line labeled "XH" identifies the resonance frequency of the resonators XH1 and XH2, which is adjacent to the upper edge of the filter passband. The two lines labeled "SF1" identify the resonance frequencies of the XBARs within sub-filter 1 in isolation. Note that both of the resonance frequencies are lower than the center of the passband. This is because the resonance frequency of a resonator and a capacitor in series is higher that the resonance frequency of the resonator in isolation. Similarly, the two lines labeled "SF2" identify the resonance frequencies of the XBARs within sub-filter 2 and the two lines labeled "SF3" identify the resonance frequencies of the XBARs within sub-filter 3.

Figure 6:
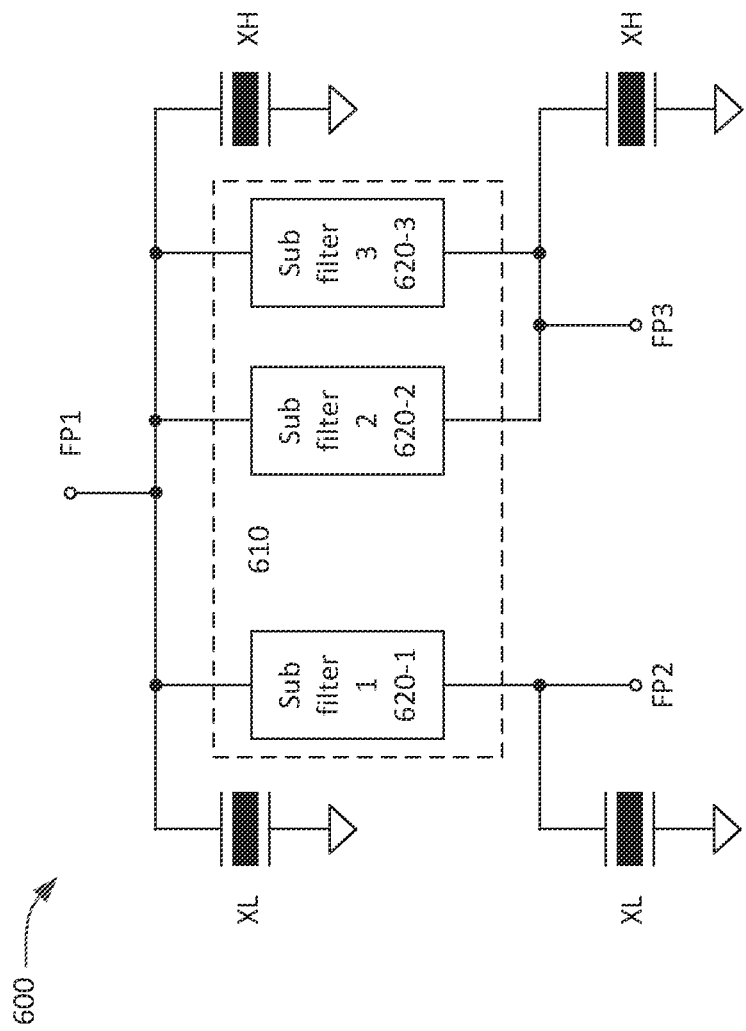
FIG. 6 is a schematic diagram of a matrix diplexer using acoustic resonators.

FIG. 6 is a schematic diagram of a matrix filter 600 configured as a diplexer. The matrix filter 600 includes an array 610 of three sub-filters 620-1, 620-2, 620-n. Sub-filter 1 620-1 is connected between a first filter port (FP1) and a second filter port (FP2). Sub-filter 2 620-2 and sub-filter 3 620-3 are connected in parallel between FP1 and a third filter port (FP3). FP1 is the common port of the diplexer and FP2 and FP3 are the branch ports. The array 610 of sub-filters is terminated at both ends by XBARs XL and XH as previously described.

Figure 7:
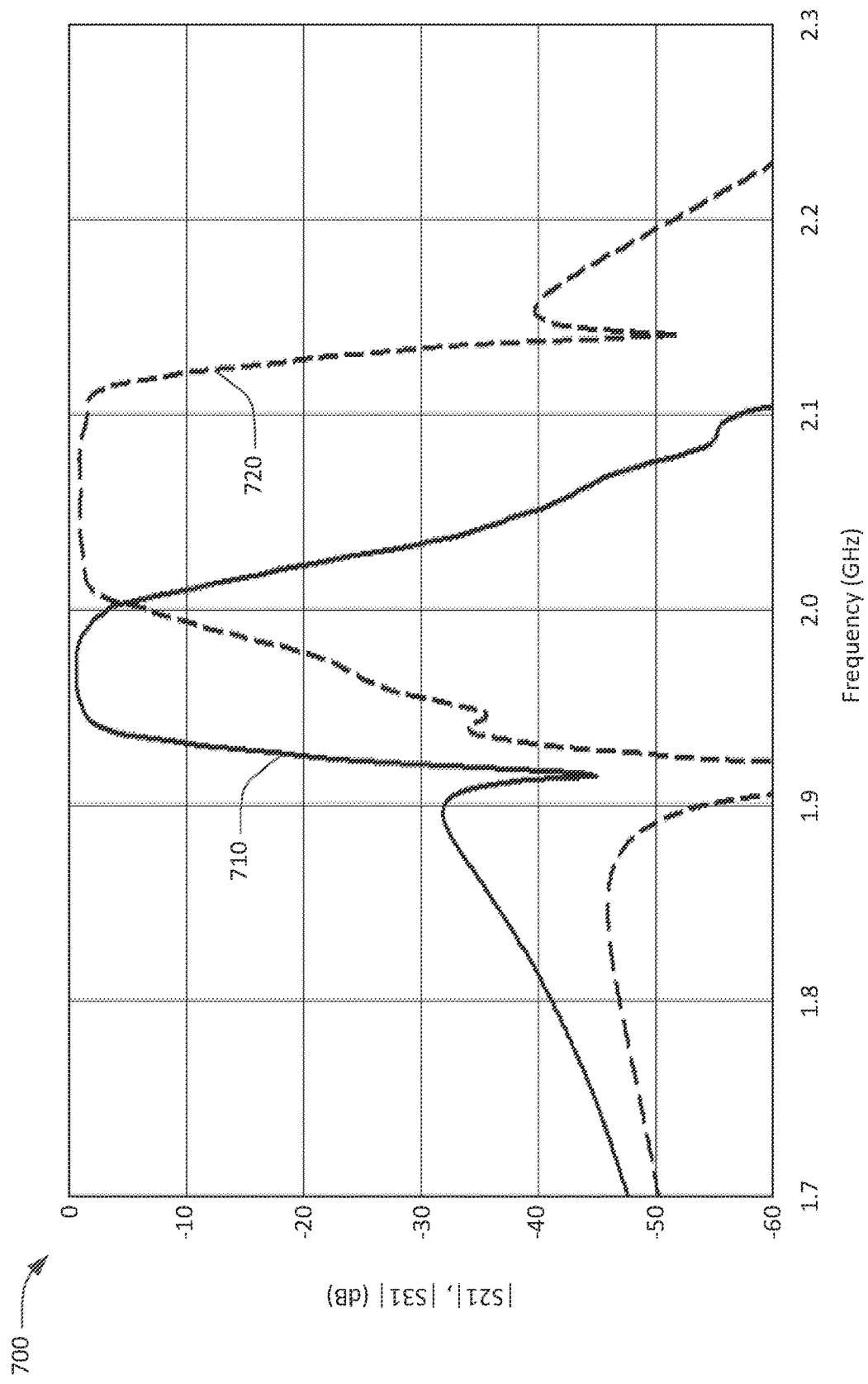
FIG. 7 is a graph of input-output transfer functions of an embodiment of the diplexer of FIG. 6.

FIG. 7 is a graph 700 of the performance of an example of the matrix filter diplexer 600 of FIG. 6. In this example, XL, XH, and the three sub-filters are the same as the corresponding elements of the matrix filter 300 of FIG. 3A. In FIG. 7, the solid line 710 is a plot of S21, the FP1 to FP2 transfer function, as a function of frequency. The dashed line 720 is a plot of S31, the FP1 to FP3 transfer function, as a function of frequency. Since the exemplary filter is symmetrical, the solid line 710 and the dashed line 720 are also plots of S12 and S13, respectively. The matrix filter 600 is exemplary. In most applications, a diplexer will have the same number (two, three or more) sub-filters in parallel between the common port and the two branch ports.

FP1 may be considered the common port of the matrix filter diplexer 600. FP2 may be considered the "low band" port and FP3 may be considered the "high band" port. When the matrix filter diplexer is used in a frequency division duplex radio, one of FP2 and FP3 may be the receive port of the diplexer and the other of FP2 and FP3 may be the transmit port of the diplexer depending on the frequencies allocated for reception and transmission.

Figure 8:
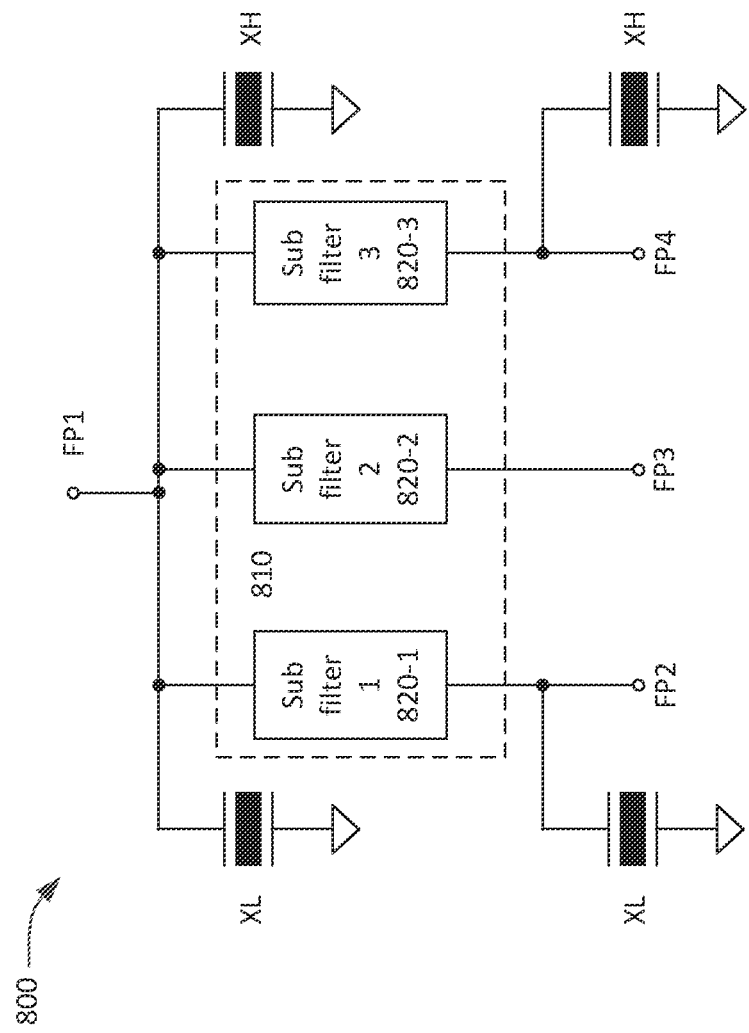
FIG. 8 is a schematic diagram of a matrix multiplexer using acoustic resonators.

FIG. 8 is a schematic diagram of a matrix filter 800 configured as a multiplexer. The matrix filter 800 includes an array 810 of three sub-filters 820-1, 820-2, 820-n. Sub-filter 1 820-1 is connected between a first filter port (FP1) and a second filter port (FP2). Sub-filter 2 820-2 is connected between FP1 and a third filter port (FP3). Sub-filter 3 820-3 is connected between FP1 and a fourth filter port (FP4). The array 810 of sub-filters is terminated at both ends by XBARs XL and XH as previously described. FP1 is the common port of the multiplexer and FP2, FP3, and FP4 are branch ports of the multiplexer. A multiplexer may have more than three branch ports.

Figure 9:
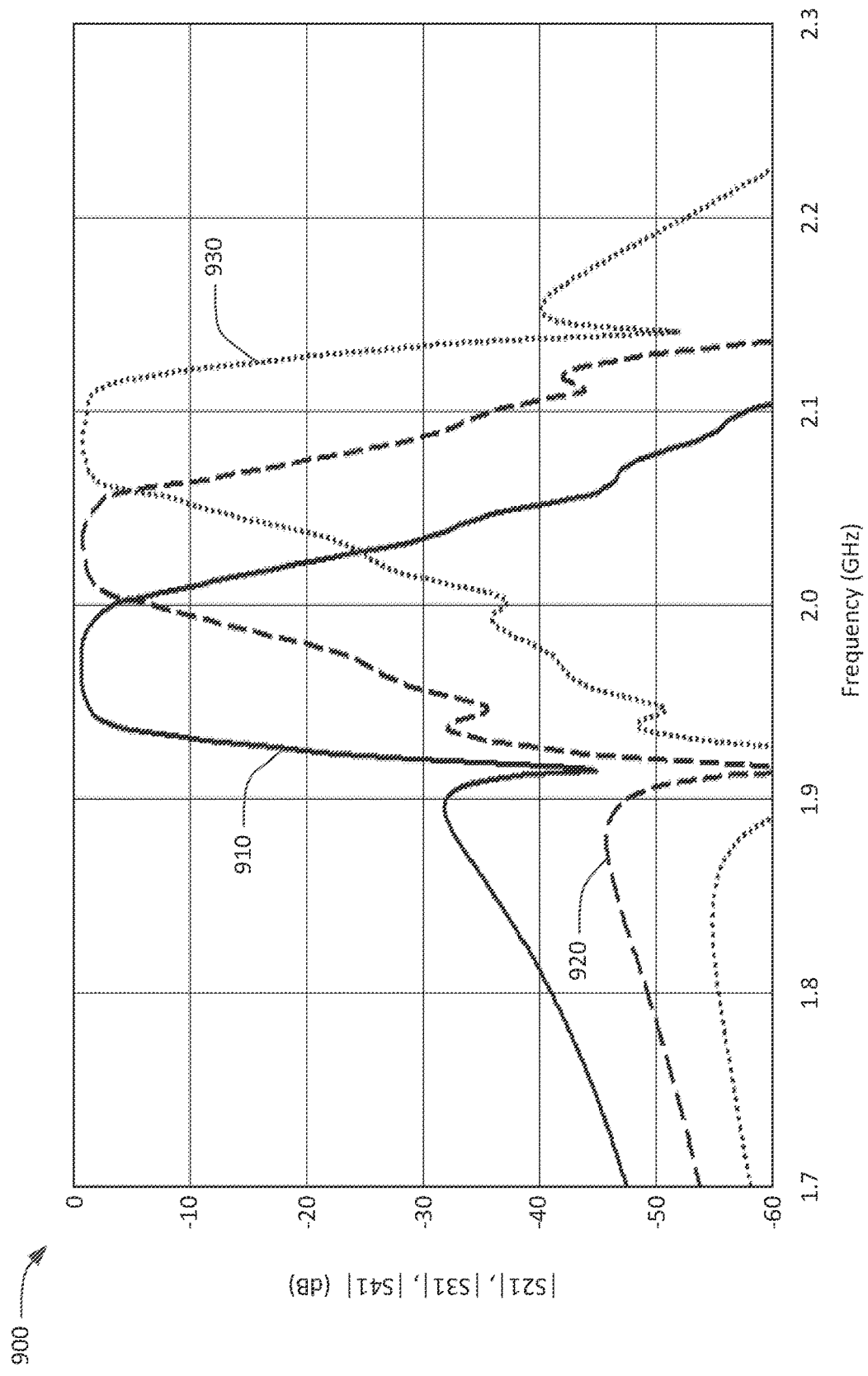
FIG. 9 is a graph of input-output transfer functions of an embodiment of the multiplexer of FIG. 8.

FIG. 9 is a graph 900 of the performance of an example of the matrix filter multiplexer 800 of FIG. 8. In this example, XL, XH, and the three sub-filters are the same as the corresponding elements of the matrix filter 300 of FIG. 3A. In FIG. 9, the solid line 910 is a plot of S21, the FP1 to FP2 transfer function, as a function of frequency. The dashed line 920 is a plot of S31, the FP1 to FP3 transfer function, as a function of frequency. The dotted line 930 is a plot of S41, the FP1 to FP4 transfer function, as a function of frequency. Since the exemplary filter is symmetrical, the solid line 910, the dashed line 920, and the dotted line 930 are also plots of S12, S13 and S14, respectively.

Figures 10A, 10B:
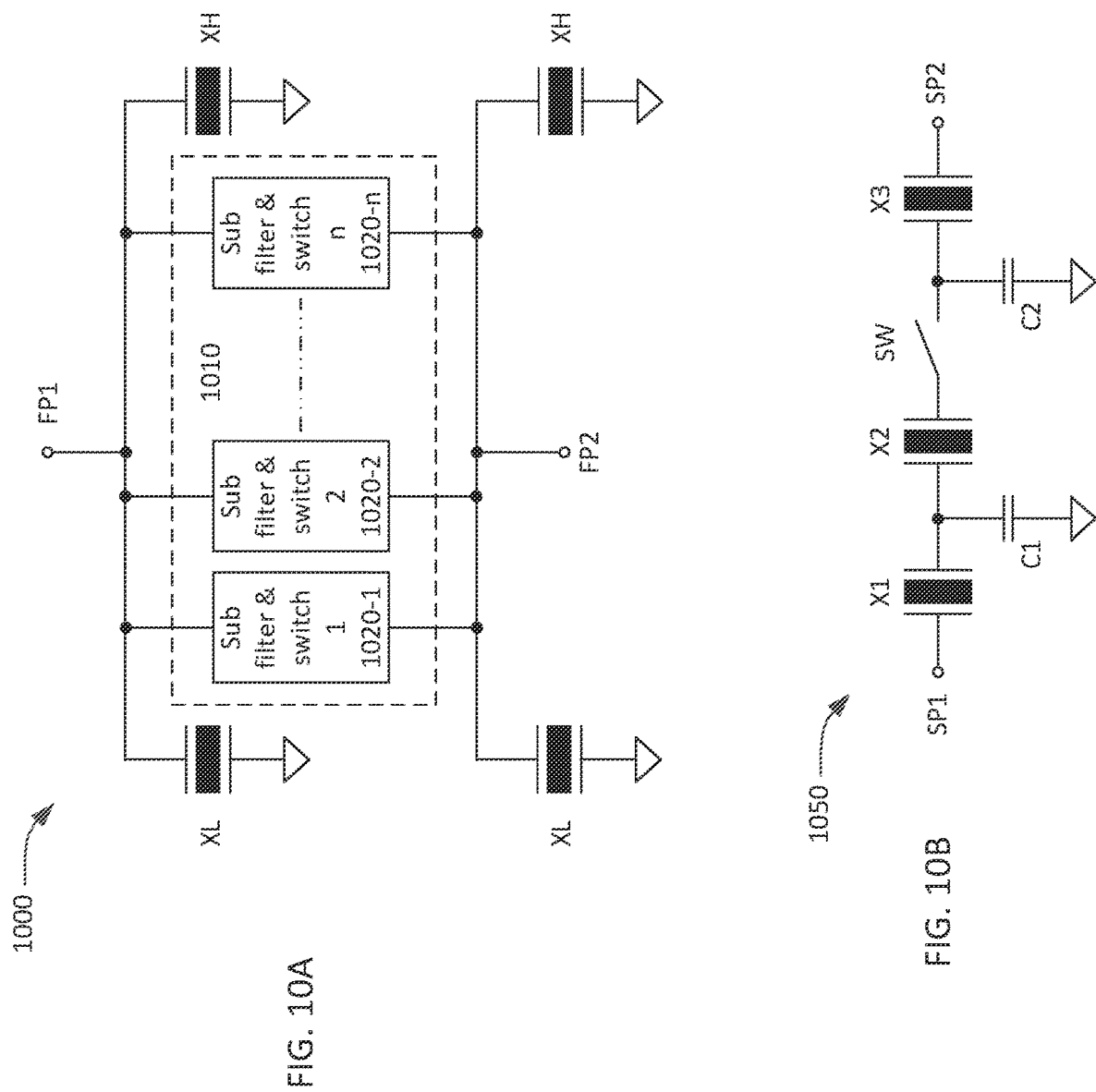
FIG. 10A is a schematic diagram of a reconfigurable matrix filter using acoustic resonators.
FIG. 10B is a schematic diagram of a sub-filter and switch module of FIG. 10A.

FIG. 10A is a schematic diagram of a reconfigurable matrix filter 1000 using XBARs. The reconfigurable matrix filter 1000 includes an array 1010 of n sub-filter/switch circuits 1020-1, 1020-2, 1020-n connected in parallel between a first filter port (FP1) and a second filter port (FP2), where n is an integer greater than one. In a subsequent example, n=3. n can be greater than 3 as necessary to provide the desired bandwidth for the reconfigurable matrix filter 1000. Each sub-filter/switch circuit functions as a bandpass filter that can be selectively enabled (i.e. connected between FP1 and FP2) or disabled (i.e. not connected between FP1 and FP2). The array 1010 of sub-filter/switch circuits is terminated at both ends by XBARs XL and XH as previously described.

The sub-filter/switch circuits 1020-1, 1020-2, 1020-n have contiguous passbands such that the bandwidth of the matrix filter 1000, when all sub-filter/switch modules are enabled, is equal to the sum of the bandwidths of the constituent sub-filters. One or more of the sub-filter/switch circuits can be disabled to tailor the matrix filter bandwidth or to insert notches or stop bands within the overall passband.

FIG. 10B is a schematic diagram of a sub-filter/switch circuit 1050 suitable for sub-filter/switch circuits 1020-1, 1020-2, and 1020-n in FIG. 10A. The sub-filter/switch circuit 1050 includes three acoustic resonators X1, X2, X3 in series between a first sub-filter port (SP1) and a second sub-filter port (SP2), and coupling capacitors C1, C2 connected from the junctions between adjacent acoustic resonators to ground. The inclusion of three acoustic resonators in the sub-filter/switch circuit 1050 is exemplary, and a sub-filter/switch circuit may have more than three acoustic resonators. When a sub-filter/switch circuit includes more than three acoustic resonators, the number of coupling capacitors will be one less than the number of acoustic resonators. The acoustic resonators X1, X2, X3 are preferably but not necessarily XBARs.

The sub-filter/switch circuit 1050 includes a switch SW in series with acoustic resonator X2. When the switch SW is closed, the sub-filter/switch circuit operates as a sub-filter suitable for use in any of the prior examples. When the switch SW is open, the sub-filter/switch circuit presents the proper impedance to SP1 and SP2 but has the input-output transfer function of an open circuit. When a sub-filter/switch circuit includes more than three acoustic resonators, the switch may be in series with any of the acoustic resonators other than the two acoustic resonators connected to the two sub-filter ports. In other words, the switch can be in series with any of the "middle acoustic resonators" in the middle of the string of resonators, but not the two "end acoustic resonators" at the ends of the string.

Figure 11:
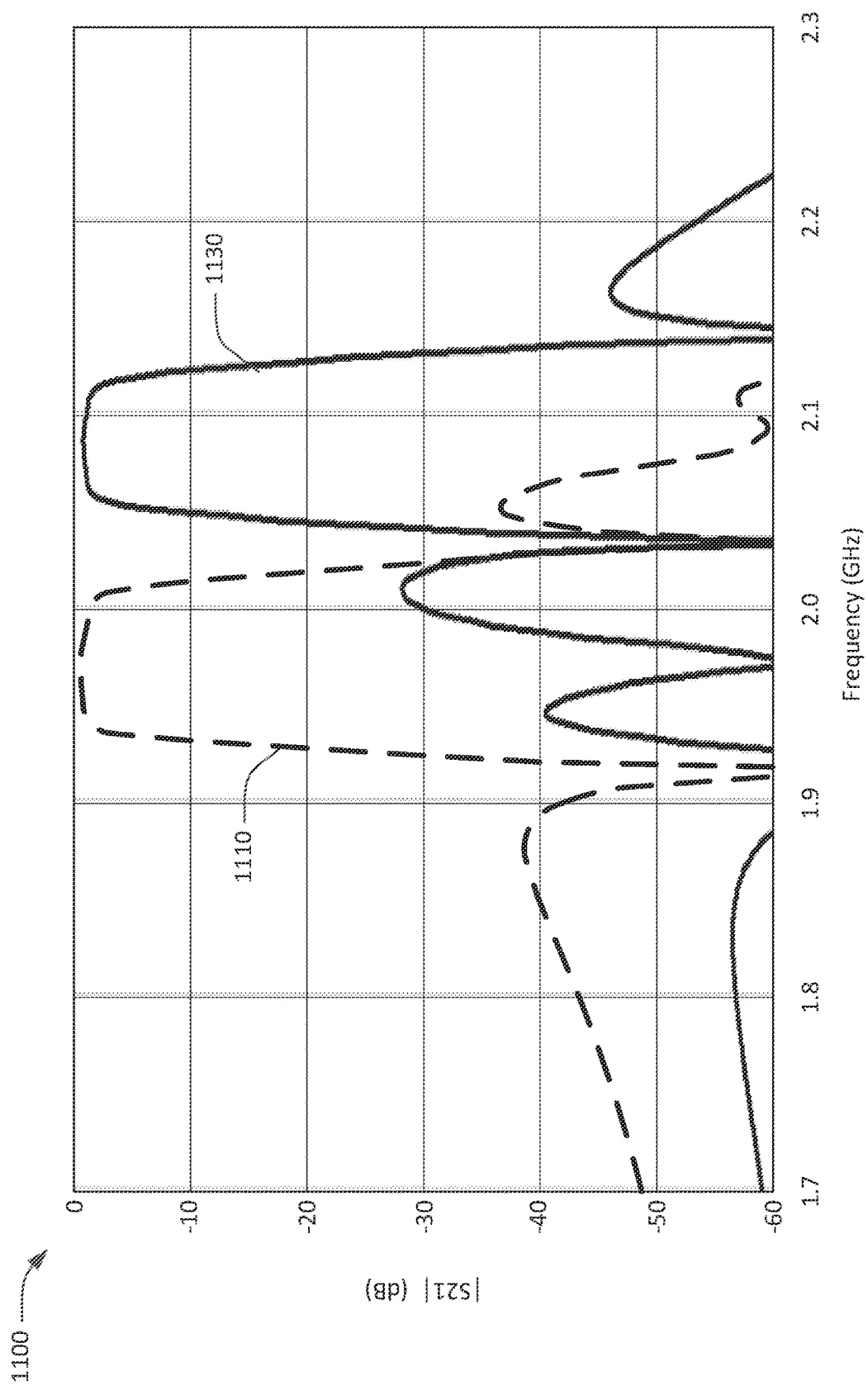
FIG. 11 is a graph of input-output transfer functions of two configurations of an embodiment of the reconfigurable matrix filter of FIG. 10A.

FIG. 11 is a graph 1100 of the performance of an example of the reconfigurable matrix filter diplexer 1000 of FIG. 10. In this example, XL, XH, and the components within the three sub-filter/switch circuits are the same as the corresponding elements of the matrix filter 300 of FIG. 3A. In FIG. 11, the solid line 1130 is a plot of S21, the port 1 to port 2 transfer function, of the filter as a function of frequency when sub-filter/switch circuit 1 is enabled and sub-filter/switch circuit 2 and 3 are disabled. The dashed line 1110 is a plot of S21 as a function of frequency when sub-filter/switch circuit 3 is enabled and sub-filter/switch circuit 1 and 2 are disabled. The sum of the two curves 1110 and 1130, not shown but easily envisioned, is the port 1 to port 2 transfer function as a function of frequency when sub-filter/switch circuits 1 and 3 are enabled and sub-filter/switch circuit 2 is disabled. A total of eight different filter configurations are possible by enabling various combinations of the three sub-filter/switch circuits.

Figure 12:
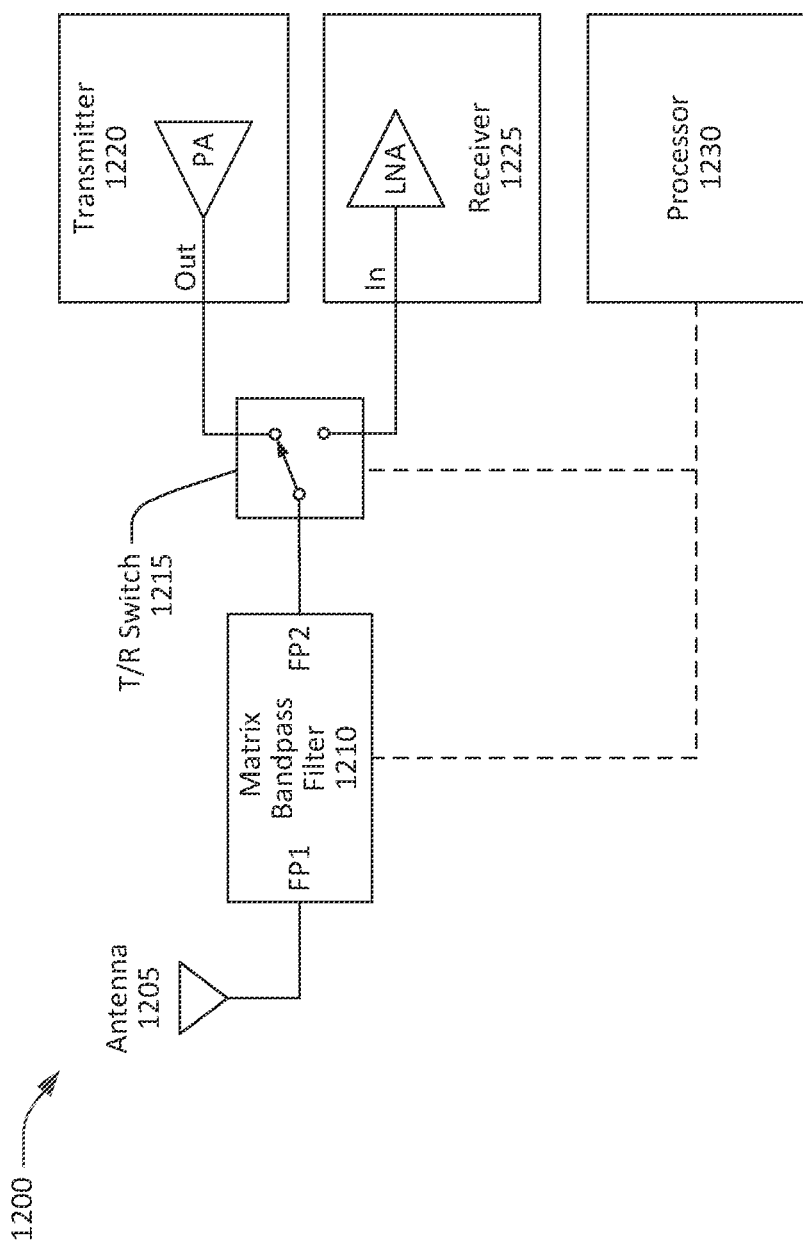
FIG. 12 is a block diagram of a time division duplex radio using a matrix filter.

FIG. 12 is a schematic block diagram of a time division duplex (TDD) radio 1200. A TDD radio transmits and receives in the same frequency channel within a designated communications band. The radio 1200 includes a matrix bandpass filter 1210 having a first filter port FP1 configured to connect to an antenna 1205 and a second filter port FP2 coupled to a transmit/receive (T/R) switch 1215. The T/R switch 1215 connects the second port of the matrix bandpass filter 1210 to either the output of a transmitter 1220 or the input of a receiver 1225. The T/R switch 1215, the transmitter 1220, and the receiver 1225 are supervised by a processor 1230 performing a media access control function. Specifically, the processor 1230 controls the operation of the T/R switch 1215 and, when the matrix bandpass filter 1210 is reconfigurable, the processor 1230 may control the operation of switches within the bandpass filter. The antenna 1205 may be a part of the radio 1200 or external to the radio 1200.

The radio 1200 is configured for operation in the designated communications band. The matrix bandpass filter 1210 has a pass band that encompasses the designated communications band and one or more stop bands to block designated frequencies outside of the designated communications band. Preferably, the bandpass filter 1210 has low loss in its pass band and high rejection in its stop band(s). Further, the bandpass filter 1210 must be compatible with TDD operation, which is to say stable and reliable while passing the RF power generated by the transmitter 1220. The matrix bandpass filter 1210 may be the matrix filter 300 of FIG. 3A or the reconfigurable matrix filter 1000 of FIG. 10A implemented using acoustic resonators which may be XBARs.

The matrix bandpass filter 1210 may be a reconfigurable matrix filter as shown in FIG. 10A. The use of a reconfigurable filter would allow the bandwidth of the filter to be reduced to a single channel or group of channels within the designated communications band. This may reduce interference from and with other radios communicating in the same communications band. When the matrix bandpass filter 1210 is reconfigurable, the switches within the sub-filters may be controlled by the process 1230.

Figure 13:
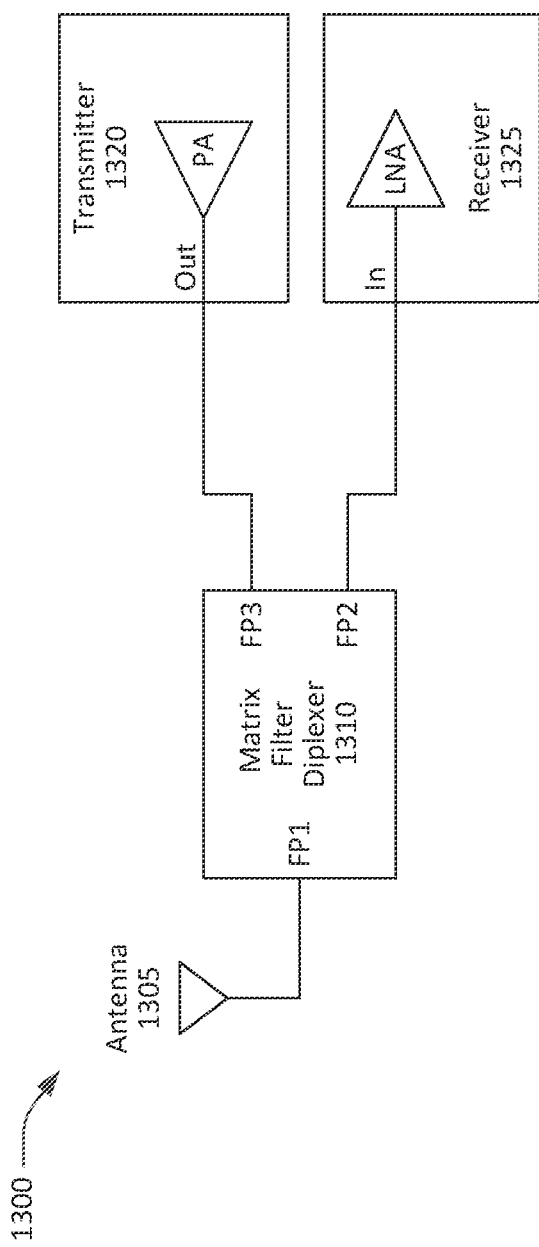
FIG. 13 is a block diagram of a frequency division duplex radio using a matrix filter.

FIG. 13 is a schematic block diagram of a frequency division duplex (FDD) radio 1300. An FDD radio transmits and receives in different frequency ranges with a defined communications band. The transmit and receive frequency ranges are typically, but not necessarily, adjacent. The radio 1300 includes an antenna 1305, a matrix filter diplexer 1310 having a common filter port FP1 configured to connect to an antenna 1305, a transmit filter port FP3 coupled to the output of a transmitter 1320, and a receive filter port FP2 coupled to the input of a receiver 1325.

The radio 1300 is configured for operation in the designated communications band. The matrix filter diplexer 1310 includes a receive filter coupled between FP1 and FP2 and a transmit filter coupled between FP1 and FP3. The receive filter may include one or more receive sub-filters. The transmit filter may include one or more transmit sub-filters. The transmit filter must be compatible with the RF power generated by the transmitter 1320. The matrix filter diplexer 1310 may be implemented using acoustic resonators which may be XBARs.

The matrix filter diplexer 1310 may be similar to the matrix diplexer 600 of FIG. 6 with an equal number of sub-filters in the transmit and receive filters. The common filter port of the matrix filter diplexer 1310 may be FP1 of the matrix diplexer 600 may be port 1 of the diplexer 600. The transmit port TP may be either of FP2 or FP3, and the receive port RP may be the other of FP2 and FP3.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter, comprising:
   a first filter port and a second filter port;
   n sub-filters, where n is an integer greater than one, each of the n sub-filters having a first sub-filter port connected to the first filter port and a second sub-filter port connected to the second filter port;
   a first acoustic resonator connected between the first filter port and ground; and
   a second acoustic resonator connected between the second filter port and ground, wherein
   the first and second acoustic resonators are configured to create respective transmission zeros adjacent to a lower edge of a passband of the filter.

2. The filter of claim 1, wherein
   the passband of the filter is equal to a sum of passbands of the n sub-filters.

3. The filter of claim 1 wherein the first and second acoustic resonators are transversely-excited film bulk acoustic resonators (XBARs).

4. The filter of claim 1, further comprising:
   a third acoustic resonator connected between the first filter port and ground; and
   a fourth acoustic resonator connected between the second filter port and ground, wherein
   the third and fourth acoustic resonators are configured to create transmission zeros adjacent to an upper edge of the passband of the filter.

5. The filter of claim 4 wherein the third and fourth acoustic resonators are transversely-excited film bulk acoustic resonators (XBARs).

6. The filter of claim 1, each of the n sub-filters comprising:
   m acoustic resonators connected in series between the first sub-filter port and the second sub-filter port, where m is an integer greater than one; and
   m−1 capacitors, each capacitor connected between ground and a node between a respective pair of acoustic resonators from the m acoustic resonators.

7. The filter of claim 6 wherein the m acoustic resonators in each of the n sub-filters are transversely-excited film bulk acoustic resonators (XBARs).

8. The filter of claim 6, wherein
   the m acoustic resonators of each of the n sub-filters include a first end acoustic resonator connected to the first sub-filter port, a second end acoustic resonator connected to the second sub-filter port, and one or more middle acoustic resonators connected between the first and second end acoustic resonator, and
   each of the n sub-filters further comprises a switch in series with one of the one or more middle resonators.

9. A time division duplex (TDD) radio, comprising:
   a transmitter;
   a receiver;
   a filter, comprising:
      a first filter port configured for connecting to an antenna and a second filter port;
      n sub-filters, where n is an integer greater than one, each sub-filter having a first sub-filter port connected to the first filter port and a second sub-filter port connected to the second filter port;
      a first acoustic resonator connected between the first filter port and ground; and
      a second acoustic resonator connected between the second filter port and ground, wherein
      the first and second acoustic resonators are configured to create respective transmission zeros adjacent to a lower edge of a passband of the filter; and a transmit/receiver switch to selectively connect the second filter port to one of an output of the transmitter and an input of the receiver.

10. The radio of claim 9, wherein the passband of the filter is equal to a sum of passbands of the n sub-filters.

11. The radio of claim 9, wherein the first and second acoustic resonators are transversely-excited film bulk acoustic resonators (XBARs).

12. The radio of claim 9, further comprising:

a third acoustic resonator connected between the first filter port and ground; and a fourth acoustic resonator connected between the second filter port and ground, wherein the third and fourth acoustic resonators are configured to create transmission zeros adjacent to an upper edge of the passband of the filter.

13. The radio of claim 12, wherein the third and fourth acoustic resonators are transversely-excited film bulk acoustic resonators (XBARs).

14. The radio of claim 9, each of the n sub-filters comprising:

m acoustic resonators connected in series between the first sub-filter port and the second sub-filter port, where m is an integer greater than one; and m−1 capacitors, each capacitor connected between ground and a node between a respective pair of acoustic resonators from the in acoustic resonators.

15. The radio of claim 14, wherein the in acoustic resonators in each of the n sub-filters are transversely-excited film bulk acoustic resonators (XBARs).

16. The radio of claim 14, wherein the in acoustic resonators of each of the n sub-filters include a first end acoustic resonator connected to the first sub-filter port, a second end acoustic resonator connected to the second sub-filter port, and one or more middle acoustic resonators connected between the first and second end acoustic resonator, and each of the n sub-filters further comprises a switch in series with one of the one or more middle resonators.

17. The radio of claim 16, further comprising:

a processor to control the transmit/receive switch and the switches within each of the n sub-filters.

18. The Radio of claim 9, further comprising the antenna.

\* \* \* \* \*